United States Patent
Takaki et al.

(10) Patent No.: US 6,628,456 B2
(45) Date of Patent: Sep. 30, 2003

(54) ULTRAVIOLET AND VACUUM ULTRAVIOLET ANTIREFLECTION SUBSTRATE

(75) Inventors: Satoru Takaki, Yokohama (JP); Kaname Okada, Yokohama (JP); Shinya Kikugawa, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/138,558

(22) Filed: May 6, 2002

(65) Prior Publication Data

US 2003/0025991 A1 Feb. 6, 2003

Related U.S. Application Data

(63) Continuation of application No. PCT/JP00/07724, filed on Nov. 2, 2000.

(30) Foreign Application Priority Data

Nov. 5, 1999 (JP) .............................. 11-315376

(51) Int. Cl.$^7$ ................................. G02B 5/08
(52) U.S. Cl. ................ 359/359; 359/360; 359/361; 359/356
(58) Field of Search ................ 359/359, 360, 359/361, 356, 357, 358, 350, 586

(56) References Cited

U.S. PATENT DOCUMENTS 5,963,365 A    10/1999 Shirai

FOREIGN PATENT DOCUMENTS

| EP | 0 373 923 | 6/1990 |
|---|---|---|
| JP | 63-113501 | 5/1988 |
| JP | 63-142302 | 6/1988 |
| JP | 5-188203 | 7/1993 |
| WO | WO 01/35125 | 5/2001 |

OTHER PUBLICATIONS

H.A. Macleod, *Thin–Film Optical Filters*, McGraw–Hill Publishing Co., pp. 72–74.

Alfred Thelen, *Design of Optical Intereference Coatings*, Mc–Graw–Hill Publishing Co., pp. 86–88, 1989.

*Primary Examiner*—Mohammad Sikder
(74) *Attorney, Agent, or Firm*—Oblon, Spivak, McClelland, Maier & Neustadt, P.C.

(57) ABSTRACT

An antireflection substrate comprising a substrate which is transparent to ultraviolet and vacuum ultraviolet rays in the wavelength region from 155 nm to 200 nm and a mono-, bi- or tri-layer antireflection film formed on at least one side of the substrate, wherein the refractive index and the physical thickness of the antireflection film at the center wavelength $\lambda_o$ of the wavelength region of ultraviolet or vacuum ultraviolet light which needs antireflection satisfy particular conditions, and an optical component for a semiconductor manufacturing apparatus and a substrate for a low-reflection pellicle which is the ultraviolet and vacuum ultraviolet antireflection substrate

13 Claims, 1 Drawing Sheet

__ULTRAVIOLET AND VACUUM ULTRAVIOLET ANTIREFLECTION SUBSTRATE__

TECHNICAL FIELD

The present invention relates to an ultraviolet and vacuum ultraviolet antireflection substrate. In particular, it relates to an antireflection substrate suitable for various low-reflection lenses, substrates of low-reflection photomasks and substrates of low-reflection pellicles (pellicle membranes) used in exposure to light in the ultraviolet and vacuum ultraviolet regions in manufacture of semiconductor integrated circuits.

BACKGROUND ART

In recent years, the resolution of exposure systems for fabrication of semiconductor integrated circuits is increasing in order to improve the integration of semiconductor circuits. Exposure light having shorter wavelengths is increasingly used to improve the resolution of exposure systems, and exposure light has changed from g-line (wavelength: 435 nm) to i-line (wavelength: 365 nm) and then to KrF excimer laser beams (wavelength: 248 nm) in current use. Even ArF excimer laser beams (wavelength: 193 nm) and $F_2$ laser beams (wavelength: 157 nm) in the vacuum ultraviolet region are being put into practical use.

These exposure systems use optical materials such as lenses, photomasks and pellicles, which serve as dust covers for photomasks. A familiar material for lenses and photomasks is synthetic quartz glass, while synthetic quartz glass and transparent fluoroplastics are known as materials for pellicle membranes.

However, the refractive indices of such materials as synthetic quartz glass and transparent fluoroplastics increase as the wavelength of the exposure light becomes shorter, and therefore, if nothing is done, the light loss resulting from surface reflection and the development of flare ghosts are prominent. There is another problem that the high light transmission, for example, of at least 95%, required in the ultraviolet region and the vacuum ultraviolet region is not secured.

Therefore, the first object of the present invention is to provide an antireflection substrate which suppresses light loss resulting from surface reflection and development of flare ghosts in the ultraviolet region and the vacuum ultraviolet region.

The second object of the present invention is to provide an antireflection substrate having high light transmission.

DISCLOSURE OF THE INVENTION

The present invention provides an ultraviolet and vacuum ultraviolet antireflection substrate (hereinafter referred to as "the first substrate") comprising a substrate which is transparent to ultraviolet and vacuum ultraviolet rays in the wavelength region from 155 nm to 200 nm and a monolayer antireflection film formed on at least one side of the substrate, wherein the center wavelength $\lambda_0$ of the wavelength region of ultraviolet or vacuum ultraviolet light which needs antireflection, the refractive index $n_s$ of the substrate at the wavelength of $\lambda_0$, the refractive index $n_1$ of the antireflection film at the wavelength of $\lambda_0$ and the physical thickness $d_1$ of the antireflection film satisfy the conditions that $n_1<n_s$, and that $n_1 d_1$ is almost $(1/4+m/2)\lambda_0$ (wherein m is an integer of at least 0).

In the present invention, $n_1 d_1$ being almost $(1/4+m/2)\lambda_0$ (m is an integer of at least 0) means that $(0.187+m/2)\lambda_0 \leq n_1 d_1 \leq (0.327+m/2)\lambda_0$.

The present invention also provides an ultraviolet and vacuum ultraviolet antireflection substrate (hereinafter referred to as "the second substrate") comprising a substrate which is transparent to ultraviolet and vacuum ultraviolet rays in the wavelength region from 155 nm to 200 nm and a bilayer antireflection film comprising a second layer and a first layer formed on at least one side of the substrate in this order from the substrate side, wherein the center wavelength $\lambda_0$ of the wavelength region of ultraviolet or vacuum ultraviolet light which needs antireflection, the refractive index $n_s$ of the substrate at the wavelength of $\lambda_0$, the refractive index $n_2$ of the second layer at the wavelength of $\lambda_0$, the physical thickness $d_2$ of the second layer, the refractive index $n_1$ of the first layer at the wavelength of $\lambda_0$, and the physical thickness $d_1$ of the first layer satisfy the conditions that $n_1<n_s<n_2$, that $n_1 d_1$ is almost $(1/4+m/2)\lambda_0$ (wherein m is an integer of at least 0), and that $0.05\lambda_0 \leq n_2 d_2 \leq 0.50\lambda_0$.

The present invention further provides an ultraviolet and vacuum ultraviolet antireflection substrate (hereinafter referred to as "the third substrate") comprising a substrate which is transparent to ultraviolet and vacuum ultraviolet rays in the wavelength region from 155 nm to 200 nm and a trilayer antireflection film comprising a third layer, a second layer and a first layer formed on at least one side of the substrate in this order from the substrate side, wherein the center wavelength $\lambda_0$ of the wavelength region of ultraviolet or vacuum ultraviolet light which needs antireflection, the refractive index $n_s$ of the substrate at the wavelength of $\lambda_0$, the refractive index $n_3$ of the third layer at the wavelength of $\lambda_0$, the physical thickness $d_3$ of the third layer, the refractive index $n_2$ of the second layer at the wavelength of $\lambda_0$, the physical thickness $d_2$ of the second layer, the refractive index $n_1$ of the first layer at the wavelength of $\lambda_0$, and the physical thickness $d_1$ of the first layer satisfy the following conditions (1) to (4):

$$n_1, n_3 < n_s \text{ and } n_1, n_3 < n_2, \qquad (1)$$

$$0 < n_1 d_1 \leq 0.47\lambda_0, \qquad (2)$$

$$0.14\lambda_0 \leq n_3 d_3 \leq 0.33\lambda_0, \qquad (3)$$

and $$0.16\lambda_0 \leq n_2 d_2 \leq 0.38\lambda_0, \qquad (4)$$

$$0.64\lambda_0 \leq n_2 d_2 \leq 0.86\lambda_0,$$

or $$1.13\lambda_0 \leq n_2 d_2 \leq 1.35\lambda_0.$$

BEST MODE FOR CARRYING OUT THE INVENTION

Figure 1:
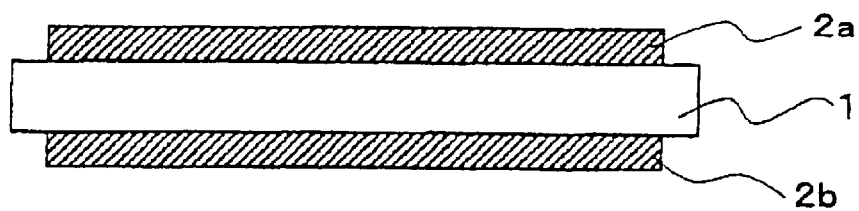
FIG. 1 is a schematic sectional view of the first substrate of the present invention.

Specific Embodiments are described below.

The antireflection film of the first substrate, or the film in contact with the substrate, is preferably made of at least one species selected from the group consisting of $MgF_2$, $AlF_2$, $BaF_2$, LiF, $SrF_2$, $Na_3AlF_6$, $NaAlF_2$ and $CaF_2$. Especially, it is preferred to be a layer made of at least one species selected from the group consisting of $MgF_2$ and $CaF_2$.

Each layer in the antireflection film of the second substrate is a layer made of at least one species selected from the group consisting of $MgF_2$, $AlF_2$, $BaF_2$, LiF, $SrF_2$, $Na_3AlF_6$, $NaAlF_2$, $CaF_2$, $LaF_2$, $PbF_2$, $YF_3$, $SiO_2$, $Al_2O_3$ and $HfO_2$. More specifically, the layer closer to the substrate (the second layer) is the same as the above-mentioned antireflection film of the first substrate, and the upper layer (the first layer) is made of at least one species selected from $LaF_2$, $PbF_2$, $YF_3$, $SiO_2$, $Al_2O_3$ and $HfO_2$. Each layer in the antireflection film of the second substrate is preferably made of at least one species selected from $MgF_2$, $CaF_2$, $SiO_2$, $Al_2O_3$ and $HfO_2$.

Each layer in the antireflection film of the third substrate is a layer made of at least one species selected from the group consisting of $MgF_2$, $AlF_2$, $BaF_2$, LiF, $SrF_2$, $Na_3AlF_6$, $NaAlF_2$, $CaF_2$, $LaF_2$, $PbF_2$, $YF_3$, $SiO_2$, $Al_2O_3$ and $HfO_2$. More specifically, the two layers closer to the substrate are the same as the above-mentioned antireflection film of the second substrate, and the outermost layer is a layer made of at least one species selected from $MgF_2$, $AlF_2$, $BaF_2$, LiF, $SrF_2$, $Na_3AlF_6$, $NaAlF_2$, $CaF_2$ and $SiO_2$. Each layer in the antireflection film of the third substrate is preferably made of at least one species selected from $MgF_2$, $CaF_2$, $SiO_2$, $Al_2O_3$ and $HfO_2$.

In view of control of the absorption of light at wavelengths from 150 to 200 nm, the antireflection film is made of at least one species selected from $MgF_2$, $CaF_2$, $Na_3AlF_6$, $YF_3$, $PbF_2$ and $SiO_2$.

In the present invention, the center wavelength $\lambda_0$ of the wavelength region of the ultraviolet or vacuum ultraviolet light which needs antireflection (hereinafter referred to as "the antireflection center wavelength") means the wavelength of the exposure light in the ultraviolet or vacuum ultraviolet region to be transmitted through an optical component using the antireflection substrate, and varies depending on the exposure light.

The antireflection center wavelength $\lambda_0$ is a wavelength from 150 nm to 250 nm, preferably from 150 nm to 200 nm. As $\lambda_0$, 157 nm or 193 nm may be mentioned. An antireflection substrate wherein $\lambda_0$ is 193 nm controls reflection of ArF excimer laser beams (wavelength: 193 nm) most effectively. An antireflection substrate wherein $\lambda_0$ is 157 nm controls reflection of $F_2$ laser beams (wavelength: 157 nm) most effectively.

The antireflection substrate of the present invention preferably has a light transmittance of at least 90% at the antireflection center wavelength $\lambda_0$ of the antireflection substrate of the present invention in order to secure good pattern transfer in the lithography step, when used as an optical component for a semiconductor manufacturing apparatus. The light transmittance is preferably at least 95%, more preferably at least 96%, in particular at least 98%.

The antireflection substrate of the present invention preferably uses, as the substrate, a synthetic quartz glass or a transparent fluoroplastic which is transparent to ultraviolet and vacuum ultraviolet rays in the wavelength region from 155 nm to 200 nm, particularly from 155 nm to 250 nm. In the present invention, transparent, when referred to for a synthetic quartz glass, means that the internal transmittance in the ultraviolet and vacuum ultraviolet wavelength regions of from 155 nm to 200 nm is at least 50%, preferably at least 70%, more preferably at least 80%, particularly preferably 95%. When referred to for a transparent fluoroplastic, for example, having a cyclic structure on the main chain, transparent means that the internal transmittance in the ultraviolet and vacuum ultraviolet wavelength regions of from 150 nm to 200 nm, particularly from 150 nm to 250 nm is at least 80%, preferably at least 90%, more preferably at least 95%.

In the present invention, the substrate is preferably made of a synthetic quartz glass doped with at least 1 ppm (particularly at least 10 ppm, more preferably at least 100 ppm) of fluorine in view of the laser beam resistance.

When the substrate is made of a synthetic quartz glass doped with at least 1 ppm of fluorine, use of a layer made of a fluoride as the layer in contact with the substrate secures good adhesion to the substrate and allows provision of an antireflection substrate having prominent laser beam resistance attributable to the substrate.

In the first to third substrates, the antireflection film is formed at least one side of the substrate and may be formed on the both sides of the substrate or only one side of the substrate. When the first to third substrates have antireflection films on both sides of the substrate, the two films on the opposite two sides may be different in constituent and physical thickness.

The layer in the first to third substrates which in contact with the substrate (namely, the antireflection film in the first substrate, the second layer in the second substrate or the third layer in the third substrate) and the outermost layer in the second or third substrate (namely, the first layer) are preferably made of $CaF_2$ and/or $MgF_2$ in view of durability. Layers made of $MgF_2$ are more preferable to attain low refractive index and better antireflection.

The second layer in the antireflection film of the third substrate is preferably a layer made of $SiO_2$ and/or $CaF_2$, having a small absorption coefficient. Particularly preferred is $SiO_2$ to give an antireflection film with good abrasion resistance. A small amount of Al, B, P or the like may be so incorporated in $SiO_2$ as not to ruin the effects of the present invention.

FIG. 1 shows an embodiment of the first substrate which comprises a substrate 1 and monolayer antireflection films 2a and 2b on both sides of the substrate 1. When the antireflection center wavelength $\lambda_0$, the refractive index $n_s$ of the substrate 1 at the wavelength of $\lambda_0$, the refractive indices $n_{1a}$ and $n_{1b}$ of the antireflection films 2a and 2b at the wavelength of $\lambda_0$ and the physical thicknesses $d_{1a}$ and $d_{1b}$ of the antireflection films 2a and 2b satisfy the conditions that $n_{1a}$, $n_{1b} < n_s$, and that $n_{1a}d_{1a}$ and $n_{1b}d_{1b}$ are almost $(1/4+m/2)\lambda_0$ (wherein m is an integer of at least 0), an ultraviolet and vacuum ultraviolet antireflection substrate having a reflectance (the degree of reflection from one side at the antireflection center wavelength $\lambda_0$) of at most 3%, preferably at most 2% around the wavelength $\lambda_0$ can be obtained.

Figure 2:
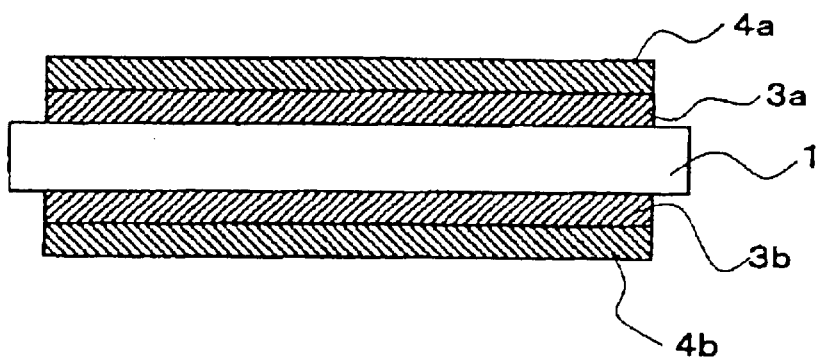
FIG. 2 is a schematic sectional view of the second substrate of the present invention.

FIG. 2 shows an embodiment of the second substrate which comprises a substrate 1 and bilayer antireflection films 3 and 4 formed on both sides of the substrate, each comprising a second layer 3a or 3b and a first layer 4a or 4b formed in this order from the substrate side. When the antireflection center wavelength $\lambda_0$, the refractive index $n_s$ of the substrate 1 at the wavelength of $\lambda_0$, the refractive indices $n_{2a}$ and $n_{2b}$ of the second layers 3a and 3b at the wavelength of $\lambda_0$, the physical thicknesses $d_{2a}$ and $d_{2b}$ of the second layers 3a and 3b, the refractive indices $n_{1a}$ and $n_{1b}$ of the first layers 4a and 4b at the wavelength of $\lambda_0$, and the physical thicknesses $d_{1a}$ and $d_{1b}$ of the first layers 4a and 4b satisfy the conditions that $n_{1a} < n_s < n_{2a}$ and $n_{1b} < n_s < n_{2b}$, that $n_{1a}d_{1a}$ and $n_{1b}d_{1b}$ are almost $(1/4+m/2)\lambda_0$ (wherein m is an integer of at least 0) and that $0.05\lambda_0 \leq n_{2a}d_{2a} \leq 0.50\lambda_0$ and $0.05\lambda_0 \leq n_{2b}d_{2b} \leq 0.50\lambda_0$, an ultraviolet and vacuum ultraviolet antireflection substrate having a reflectance (the degree of reflection from one side at the antireflection center wavelength $\lambda_0$) of at most 3%, preferably at most 2% around the wavelength $\lambda_0$ can be obtained.

Figure 3:
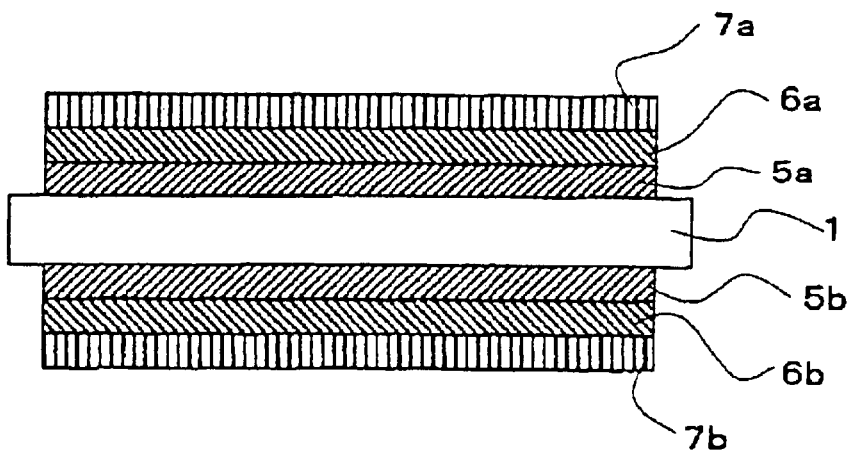
FIG. 3 is a schematic sectional view of the third substrate of the present invention.

FIG. 3 shows an embodiment of the third substrate which comprises a substrate 1 and trilayer antireflection films formed on both sides of the substrate 1, each comprising a third layer 5a or 5b, a second layer 6a or 6b and a first layer 7a or 7b formed in this order from the substrate side. When the antireflection center wavelength $\lambda_0$, the refractive index $n_s$ of the substrate 1 at the wavelength of $\lambda_0$, the refractive indices $n_{3a}$ and $n_{3b}$ of the third layers at the wavelength of $\lambda_0$, the physical thicknesses $d_{3a}$ and $d_{3b}$ of the third layers, the refractive indices $n_{2a}$ and $n_{2b}$ of the second layers at the wavelength of $\lambda_0$, the physical thicknesses $d_{2a}$ and $d_{2b}$ of the second layers, the refractive indices $n_{1a}$ and $n_{1b}$ of the first layers at the wavelength of $\lambda_0$, and the physical thicknesses $d_{1a}$ and $d_{1b}$ of the first layers satisfy the following conditions (1) to (4) concerning $n_{3a}$, $d_{3a}$, $n_{2a}$ $d_{2a}$, $n_{1a}$ and $d_{1a}$ and similar conditions concerning $n_{3b}$, $d_{3b}$, $n_{2b}$ $d_{2b}$, $n_{1b}$ and $d_{1b}$, an ultraviolet and vacuum ultraviolet antireflection substrate having a reflectance (the degree of reflection from one side at the antireflection center wavelength $\lambda_0$) of at most 3%, preferably at most 2% around the wavelength $\lambda_0$ can be obtained:

$$n_{1a}, n_{3a} < n_s \text{ and } n_{1a}, n_{3a} < n_{2a}, \quad (1)$$

$$0 < n_{1a} d_{1a} \leq 0.47\lambda_0, \quad (2)$$

$$0.14\lambda_0 \leq n_{3a} d_{3a} \leq 0.33\lambda_0, \quad (3)$$

and $$0.16\lambda_0 \leq n_{2a} d_{2a} \leq 0.38\lambda_0, \quad (4)$$

$$0.64\lambda_0 \leq n_{2a} d_{2a} \leq 0.86\lambda_0,$$

or $$1.13\lambda_0 \leq n_{2a} d_{2a} \leq 1.35\lambda_0.$$

In the present invention, the total physical thickness of the antireflection film is preferably at most 150 nm. When antireflection films are formed on both sides of the substrate, the total physical thickness of each antireflection film is preferably at most 150 nm.

The upper limit of 150 nm which inevitably imposes a limitation on the thickness of each layer, leads to control of contamination of the layers, and as a result, contributes to improvement of the transmittance. The upper limit of 150 nm which inevitably imposes a limitation on the thickness of each layer, leads to control of the surface roughness of each layer while it is being formed (by vapor deposition or the like), and as a result, contributes to control of reflection and the smoothness of the antireflection film (as is described later).

The upper limit of 150 nm makes it possible to control double refraction (as is described later) while keeping the surface tension of the antireflection film low.

It is advantageous to appropriately select the layer structure of the antireflection film, the refractive index of each layer and the physical thickness of each layer so that the reflectance around the wavelength of 632.8 nm is at most 3.5%, because the alignment of an exposure system using a He—Ne laser becomes easy.

In the present invention, the difference between the maximum and the minimum of the transmission of light at the antireflection center wavelength $\lambda_0$ by the antireflection substrate is preferably at most 1%. If the difference between the maximum and the minimum of the light transmission exceeds 1%, the antireflection substrate, when used as a substrate of a low-reflection pellicle, refracts the light path and can lead to displaced pattern transfer onto a wafer. It is particularly preferable that the difference between the maximum and the minimum of the light transmission is at most 0.5%.

In order to attain good pattern transfer in the lithography step, it is preferred that the light transmittance of the pellicle membrane is at least 90%, and the difference in the light transmittance over the entire surface of the pellicle membrane is at most 1%. "The difference in the light transmittance" is given by the subtraction of the minimum light transmittance from the maximum light transmittance.

The antireflection substrate of the present invention is suitable for optical components for semiconductor manufacturing apparatuses such as various low-reflection lenses, substrates for low-reflection photomasks and substrates for low-reflection pellicles used in exposure to light in the ultraviolet and vacuum ultraviolet regions. Especially, for use as a substrate for a low-reflection pellicle (which is generally called "pellicle membrane" because it has been made of resin film conventionally), the thickness is preferably from 1 $\mu$m to 2000 $\mu$m. If the thickness is less than 1 $\mu$m, it is hard to handle, while if the thickness is more than 2000 $\mu$m, the light absorption by the substrate is remarkable. In view of optical uniformity, it is particularly preferred that the thickness of the substrate is from 100 $\mu$m to 500 $\mu$m.

The antireflection substrate of the present invention may be produced by forming an antireflection film having the above-mentioned structure by means of a film forming machine such as an electron beam vapor deposition machine, an ion plating machine or a sputtering machine on each side or either side of the substrate. For example, when an electron beam vapor deposition machine is used, the vacuum chamber set with a substrate and vapor sources such as $MgF_2$ and $SiO_2$ is evacuated to $1 \times 10^{-3}$ Pa or below, and an antireflection film having the above-mentioned structure is formed successively, while the thickness is monitored with a film formation rate monitor of an optical type or a quartz oscillation type. Though vapor deposition of a fluoride layer does not require introduction of any particular reaction gas, an oxidizing gas such as oxygen at a partial pressure of about 0.1 Pa is preferably introduced during vapor deposition of an oxide layer to facilitate the oxidation. Heating of the substrate to about 300–400° C. before the film formation is also preferable in view of improvement in the durability and the optical properties of the antireflection film. Antireflection films may be formed on both sides of the substrate by forming one on one side of the substrate, then flipping over the substrate, and forming another on the other side.

EXAMPLES

Now, the present invention will be described in more detail with reference to specific Examples. However, the present invention is by not means restricted to those specific Examples.

Examples 1 to 27 and Comparative Example
(Preparation of Substrates)

$SiCl_4$ was hydrolyzed in an oxyhydrogen flame by the conventional soot method, and the resulting fine $SiO_2$ particles were deposited on a substrate to form a porous quartz glass body with a diameter of 400 mm and a length of 600 mm.

Then, a pressure vessel was loaded with the porous quartz glass body, and the pressure was reduced to about 133 Pa and then returned to ordinary pressure by introducing an inert gas (such as He). The pressure was reduced again to about 133 Pa, and $SiF_4$ gas diluted with an inert gas (such as He) was introduced to raise the pressure nearly to ordinary pressure. After the introduction of the $SiF_4$ gas diluted with an inert gas (such as He) was stopped, the porous quartz glass body was allowed to stand still. Thus way, the porous quartz glass body was doped with fluorine.

The fluorine-doped porous quartz glass body was treated with heat in a controlled-atmosphere electric furnace (heated under a reduced pressure of 150 Pa or below, then maintained at 1000–1300° C. for a predetermined time, heated to 1450° C. and maintained at the same temperature for 10 hours) to obtain a transparent quartz glass body (with a diameter of 200 mm and a length of 200 mm).

The glass body was ground and made into synthetic quartz glass substrates doped with 100 ppm of fluorine (with a diameter of 200 mm, a thickness of 300 μm, an internal transmittance of at least 70% in the wavelength region of from 155 nm to 250 nm, an internal transmittance of 90% at the wavelength of 157 nm, and an internal transmittance of at least 99% at the wavelengths of 193 nm and 248 nm).

(Formation of Antireflection Films)

Antireflection films having the structures shown in Tables 1 and 2 on the both sides of the fluorine-doped synthetic quartz glass substrates with a vapor deposition machine (which uses electron beams or resistance heat to heat a vapor source) to give antireflection substrates having the structure shown in FIGS. 1, 2 or 3.

The respective layers were formed by the following procedure.

A fluorine-doped synthetic quartz glass substrate and three vapor sources ($MgF_2$, $SiO_2$ and $Al_2O_3$) were set in the vacuum chamber of the vapor deposition machine, and the vacuum chamber was evacuated to $1\times10^{-3}$ Pa or below. Then, while the thickness was monitored with a film formation rate monitor of an optical type, an intended layer was deposited by heating intended vapor sources (with electron beams in the case of $HgF_2$ and with resistance heat in the cases of $SiO_2$ and $Al_2O_3$) on the substrate, repeatedly in the cases of multilayer structure, to form antireflection film.

During vapor deposition of an oxide layer, an oxidizing gas (oxygen gas in these Examples) at a partial pressure of about 0.1 Pa was introduced to facilitate the oxidation. During film formation, substrates were heated to about 300° C. After one side of a substrate was subjected to vapor deposition, the substrate was flipped over, and the opposite side was subjected to vapor deposition similarly to form antireflection films on both sides of the substrate.

(Evaluation)

Measurement of the Transmittance at the Antireflection Center Wavelength $\lambda_0$ The transmittances of the antireflection substrates obtained in Examples 1 to 27 at the antireflection center wavelength $\lambda_0$.

For measurement of the transmittances within the range of from 150 to 190 nm, a vacuum ultraviolet spectrophotometer (Acton Research, VTM-502) was used. For measurement of the transmittances within the range of from 190 to 700 nm, a spectrophotometer (Varian, Cary 500) was used.

Measurement of the Reflectance at the Antireflection Center Wavelength $\lambda_0$ The spectral reflectance of a single side of each antireflection film obtained in Examples 1 to 27 was measured by the following procedure, and the reflectances at the antireflection center wavelength $\lambda_0$ (the degrees of reflection from one side) were obtained from the results.

For measurement of the spectral reflectance, the flip side of a substrate was roughened by sand blasting so that only the light reflected from the face side could be measured by scattering the reflected light from the flip side. For measurement within the range of from 150 to 190 nm, a vacuum ultraviolet spectrophotometer (Acton Research, VTM-502) was used. For measurement within the range of from 190 to 700 nm, a spectrophotometer (Varian, Cary 500) was used.

The reflectance at the antireflection center wavelength of $\lambda_0$ was also measured with Comparative Example (a synthetic quartz glass substrate having no antireflection film).

Measurement of Thickness

The physical total thickness of the antireflection film (on one side) of Example 19 was measured with DEKTAK.

Measurement of Double Refraction

The double refraction was measured in Example 19 with EXICOR350AT manufactured by HINDS.

When the antireflection substrate of the present invention is used as an optical component for a semiconductor manufacturing apparatus, especially as the substrate for a low-reflection pellicle, it is preferred that the double refraction is at most 2 nm (particularly at most 1.5 nm) in view of the adaptability to lithography.

Measurement of Surface Roughness (Ra)

An atomic force microscope (SPI3700, manufactured by Seiko) was used for measurement of surface roughness Ra. A smaller Ra means less light scattering, less stray light generated from the exposure light and less displacement of the transferred pattern. When the antireflection substrate of the present invention is used as the substrate for a low-reflection pellicle, the smaller the Ra, the easier it is to eliminate foreign matter by an air blow. From this viewpoint, the Ra is preferably at most 1 nm.

Examples 1, 3 and 5 are embodiments wherein $n_1 d_1 = 0.25\lambda_0$, and Examples of 2, 4 and 6 are embodiments wherein $n_1 d_1 = (0.25+1/2)\lambda_0$.

Examples 7 to 9, 11 to 13 and 15 to 17 are embodiments wherein $n_1 d_1$ is almost $0.25\lambda_0$, and $0.055\lambda_0 \leq n_2 d_2 \leq 0.45\lambda_0$, and Examples 10, 14 and 18 are embodiments wherein $n_1 d_1 = (0.25+1/2)\lambda_0$, and $0.055\lambda_0 \leq n_2 d_2 \leq 0.45\lambda_0$.

Examples 19, 22 and 25 are embodiments wherein $n_1 d_1$ and $n_3 d_3$ are both almost $0.25\lambda_0$, and $0.16\lambda_0 \leq n_2 d_2 \leq 0.38\lambda_0$. Examples 20, 23 and 26 are embodiments wherein $n_1 d_1$ and $n_3 d_3$ are both almost $0.25\lambda_0$, and $0.64\lambda_0 \leq n_2 d_2 \leq 0.86\lambda_0$.

Examples 21, 24 and 27 are embodiments wherein $1.13\lambda_0 \leq n_2 d_2 \leq 1.35\lambda_0$.

With respect to Examples 19, the physical total thickness of each antireflection film (on one side) was 76 nm, the double refraction was 0.2 nm, and Ra was 0.6 nm.

Example 28

The antireflection substrate obtained in Example 19 was checked for laser beam resistance. The laser beam exposure test was carried out with a $F_2$ laser at 1 $mJ/cm^2$/pulse, 300 Hz and a total radiation energy of 10000 $J/cm^2$. After the laser beam exposure test, there was no transmittance loss, no peeling of the antireflection film or no damage.

Example 29

The antireflection substrate obtained in Example 19 was processed into a substrate for a low-reflection pellicle (120 mm×145 mm×300 μm thick) by means of a $CO_2$ laser. The resulting substrate for a low-reflection pellicle was attached to a pellicle frame to assemble a low-reflection pellicle.

After the surface of the low-reflection pellicle was swept with an air blow, the pellicle was checked for foreign matter by means of PI-1000 (manufactured by QC OPTICS), and no foreign matter was not detected.

The low-reflection pellicle was laid on a sliding XY stage, and made slidable and the transmittance at the antireflection center wavelength $\lambda_0$ (157 nm) was measured in the same manner as described above at intersections of grid lines drawn at 5 mm intervals. The difference between the maximum and the minimum of the transmittance was 0.3%.

ultraviolet light at wavelengths of from 150 nm to 200 nm in manufacture of semiconductor integrated circuits.

It is also advantageous to facilitate the alignment of an exposure system using a He—Ne laser because the reflectance around 632.8 nm can be reduced to 3.5% or lower by appropriately selecting the layer structure and the refractive index and the physical thickness of each layer.

TABLE 1

| Example | Anti-reflection center wavelength $\lambda_0$ | Third layer $(n_3 d_3/\lambda_0)$ | Second layer $(n_2 d_2/\lambda_0)$ | First layer $(n_1 d_1/\lambda_0)$ | Degree of reflection from one side at center wavelength (%) | Transmittance at center wavelength (%) |
|---|---|---|---|---|---|---|
| 1 | 157 nm | Nil | Nil | $MgF_2$ (0.25) | 1.9 | 96.0 |
| 2 | 157 nm | Nil | Nil | $MgF_2$ (0.75) | 1.8 | 96.0 |
| 3 | 193 nm | Nil | Nil | $MgF_2$ (0.25) | 2.2 | 95.5 |
| 4 | 193 nm | Nil | Nil | $MgF_2$ (0.75) | 2.2 | 95.5 |
| 5 | 248 nm | Nil | Nil | $MgF_2$ (0.25) | 2.1 | 95.5 |
| 6 | 248 nm | Nil | Nil | $MgF_2$ (0.75) | 2.1 | 95.5 |
| 7 | 157 nm | Nil | $Al_2O_3$ (0.21) | $MgF_2$ (0.23) | 1.1 | 87.6 |
| 8 | 157 nm | Nil | $Al_2O_3$ (0.058) | $MgF_2$ (0.23) | 1.9 | 93.0 |
| 9 | 157 nm | Nil | $Al_2O_3$ (0.45) | $MgF_2$ (0.23) | 1.8 | 76.2 |
| 10 | 157 nm | Nil | $Al_2O_3$ (0.21) | $MgF_2$ (0.75) | 0.9 | 94.3 |
| 11 | 193 nm | Nil | $Al_2O_3$ (0.22) | $MgF_2$ (0.25) | 0.5 | 93.4 |
| 12 | 193 nm | Nil | $Al_2O_3$ (0.055) | $MgF_2$ (0.25) | 1.9 | 94.6 |
| 13 | 193 nm | Nil | $Al_2O_3$ (0.45) | $MgF_2$ (0.25) | 2.1 | 85.6 |
| 14 | 193 nm | Nil | $Al_2O_3$ (0.22) | $MgF_2$ (0.75) | 0.5 | 93.4 |
| 15 | 248 nm | Nil | $Al_2O_3$ (0.26) | $MgF_2$ (0.25) | 0.5 | 98.9 |
| 16 | 248 nm | Nil | $Al_2O_3$ (0.055) | $MgF_2$ (0.25) | 2.1 | 95.6 |

TABLE 2

| Example | Anti-reflection center wavelength $\lambda_0$ | Third layer $(n_3 d_3/\lambda_0)$ | Second layer $(n_2 d_2/\lambda_0)$ | First layer $(n_1 d_1/\lambda_0)$ | Degree of reflection from one side at center wavelength (%) | Transmittance at center wavelength (%) |
|---|---|---|---|---|---|---|
| 17 | 248 nm | Nil | $Al_2O_3$ (0.45) | $MgF_2$ (0.25) | 2.0 | 95.8 |
| 18 | 248 nm | Nil | $Al_2O_3$ (0.26) | $MgF_2$ (0.75) | 0.5 | 98.9 |
| 19 | 157 nm | $MgF_2$ (0.24) | $SiO_2$ (0.27) | $MgF_2$ (0.23) | 0.4 | 98.9 |
| 20 | 157 nm | $MgF_2$ (0.23) | $SiO_2$ (0.80) | $MgF_2$ (0.23) | 0.5 | 98.8 |
| 21 | 157 nm | $MgF_2$ (0.22) | $SiO_2$ (1.32) | $MgF_2$ (0.21) | 0.5 | 98.9 |
| 22 | 193 nm | $MgF_2$ (0.25) | $SiO_2$ (0.25) | $MgF_2$ (0.25) | 0.6 | 98.6 |
| 23 | 193 nm | $MgF_2$ (0.25) | $SiO_2$ (0.75) | $MgF_2$ (0.25) | 0.7 | 98.6 |
| 24 | 193 nm | $MgF_2$ (0.25) | $SiO_2$ (1.25) | $MgF_2$ (0.25) | 0.6 | 98.6 |
| 25 | 248 nm | $MgF_2$ (0.25) | $SiO_2$ (0.25) | $MgF_2$ (0.25) | 0.8 | 98.2 |
| 26 | 248 nm | $MgF_2$ (0.25) | $SiO_2$ (0.75) | $MgF_2$ (0.25) | 0.8 | 98.2 |
| 27 | 248 nm | $MgF_2$ (0.25) | $SiO_2$ (1.25) | $MgF_2$ (0.25) | 0.9 | 98.2 |
| Comparative Example | 157 nm | Nil | Nil | Nil | | 87.7 |
| | 193 nm | Nil | Nil | Nil | | 90.8 |
| | 248 nm | Nil | Nil | Nil | | 92.1 |

Note
1) Layers in an antireflection film are referred to as a third layer, a second layer and a first layer in the order of closeness to the substrate.

The low-reflection pellicle was mounted on a line and space photomask (with 0.15 µm intervals) with a pellicle mounter and used in photolithography, and as a result, a good pattern was obtained.

Industrial Applicability

The antireflection substrate of the present invention controls reflection in the ultraviolet and vacuum ultraviolet regions and has high transmittance by suppressing light loss resulting from surface reflection and development of flare ghosts. Therefore, it is suitably used for various low-reflection lenses, substrates of low-reflection photomasks and substrates of low-reflection pellicles (pellicle membranes) used in exposure to ultraviolet and vacuum The entire disclosure of Japanese Patent Application No. 2000-325634 filed on May 7, 2000 including specification, claims, drawings and summary are incorporated herein by reference in its entirety.

The entire disclosures of JP11-315376, filed Nov. 5, 1999, and PCT/JP00/07724, filed Nov. 2, 2000, are incorporated herein by reference.

What is claimed is:
1. An ultraviolet and vacuum ultraviolet antireflection substrate comprising a substrate which is transparent to ultraviolet and vacuum ultraviolet rays in the wavelength region from 155 nm to 200 nm and a monolayer antireflection film formed on at least one side of the substrate, wherein the center wavelength $\lambda_0$ of the wavelength region of ultraviolet or vacuum ultraviolet light which needs antireflection, the refractive index $n_s$ of the substrate at the wavelength of $\lambda_0$, the refractive index $n_1$ of the antireflection film at the wavelength of $\lambda_0$ and the physical thickness $d_1$ of the antireflection film satisfy the conditions that $n_1<n_s$, and that $n_1d_1$ is almost $(1/4+m/2)\lambda_0$ (wherein m is an integer of at least 0).

2. An ultraviolet and vacuum ultraviolet antireflection substrate comprising a substrate which is transparent to ultraviolet and vacuum ultraviolet rays in the wavelength region from 155 nm to 200 nm and a bilayer antireflection film comprising a second layer and a first layer formed on at least one side of the substrate in this order from the substrate side, wherein the center wavelength $\lambda_0$ of the wavelength region of ultraviolet or vacuum ultraviolet light which needs antireflection, the refractive index $n_s$ of the substrate at the wavelength of $\lambda_0$, the refractive index $n_2$ of the second layer at the wavelength of $\lambda_0$, the physical thickness $d_2$ of the second layer, the refractive index $n_1$ of the first layer at the wavelength of $\lambda_0$, and the physical thickness $d_1$ of the first layer satisfy the conditions that $n_1<n_s<n_2$, that $n_1d_1$ is almost $(1/4+m/2)\lambda_0$ (wherein m is an integer of at least 0), and that $0.05\lambda_0 \leq n_2d_2 \leq 0.50\lambda_0$.

3. An ultraviolet and vacuum ultraviolet antireflection substrate comprising a substrate which is transparent to ultraviolet and vacuum ultraviolet rays in the wavelength region from 155 nm to 200 nm and a trilayer antireflection film comprising a third layer, a second layer and a first layer formed on at least one side of the substrate in this order from the substrate side, wherein the center wavelength $\lambda_0$ of the wavelength region of ultraviolet or vacuum ultraviolet light which needs antireflection, the refractive index $n_s$ of the substrate at the wavelength of $\lambda_0$, the refractive index $n_3$ of the third layer at the wavelength of $\lambda_0$, the physical thickness $d_3$ of the third layer, the refractive index $n_2$ of the second layer at the wavelength of $\lambda_0$, the physical thickness $d_2$ of the second layer, the refractive index $n_1$ of the first layer at the wavelength of $\lambda_0$, and the physical thickness $d_1$ of the first layer satisfy the following conditions (1) to (4):

$$n_1, n_3 < n_s \text{ and } n_1, n_3 < n_2, \quad (1)$$

$$0 < n_1 d_1 \leq 0.47\lambda_0, \quad (2)$$

$$0.14\lambda_0 \leq n_3 d_3 \leq 0.33\lambda_0, \quad (3)$$

and $$0.16\lambda_0 \leq n_2 d_2 \leq 0.38\lambda_0,$$

$$0.64\lambda_0 \leq n_2 d_2 \leq 0.86\lambda_0,$$

or $$1.13\lambda_0 \leq n_2 d_2 \leq 1.35\lambda_0.$$

4. The ultraviolet and vacuum ultraviolet antireflection substrate according to claim 1, wherein the total thickness of the antireflection film is at most 150 nm.

5. The ultraviolet and vacuum ultraviolet antireflection substrate according to claim 1, wherein the substrate is made of a synthetic quartz glass doped with at least 1 ppm of fluorine.

6. The ultraviolet and vacuum ultraviolet antireflection substrate according to claim 1, wherein the thickness of the substrate is from 100 μm to 500 μm.

7. The ultraviolet and vacuum ultraviolet antireflection substrate according to claim 5, wherein the layer in the antireflection film which is in contact with the substrate is made of a fluoride.

8. The ultraviolet and vacuum ultraviolet antireflection substrate according to claim 1, wherein the center wavelength $\lambda_0$ is from 150 nm to 200 nm.

9. The ultraviolet and vacuum ultraviolet antireflection substrate according to claim 8, wherein the center wavelength $\lambda_0$ is 157 nm or 193 nm.

10. The ultraviolet and vacuum ultraviolet antireflection substrate according to claim 1, wherein the reflectance around the wavelength of 632.8 nm is at most 3.5%.

11. The ultraviolet and vacuum ultraviolet antireflection substrate according to claim 1, wherein the difference between the maximum and the minimum of the transmission of light at the center wavelength $\lambda_0$ is at most 1%.

12. An optical component for a semiconductor manufacturing apparatus, which is the ultraviolet and vacuum ultraviolet antireflection substrate according to claim 1.

13. A substrate for a low-reflection pellicle, which is the ultraviolet and vacuum ultraviolet antireflection substrate according to claim 1.

* * * * *